United States Patent [19]

Ishii et al.

[11] Patent Number: 5,415,898
[45] Date of Patent: May 16, 1995

[54] METHOD OF BLASTING IC FRAMES AND APPARATUS THEREFORE

[75] Inventors: Mineo Ishii; Teruyuki Nakano, both of Fukuyama, Japan

[73] Assignee: Kabushiki Gaisha Ishii Hyoki, Hiroshima, Japan

[21] Appl. No.: 162,047

[22] PCT Filed: Jun. 18, 1992

[86] PCT No.: PCT/JP92/00783
§ 371 Date: Jan. 24, 1994
§ 102(e) Date: Jan. 24, 1994

[87] PCT Pub. No.: WO93/00704
PCT Pub. Date: Jan. 7, 1993

[30] Foreign Application Priority Data
Jun. 20, 1991 [JP] Japan ................. 3-247149

[51] Int. Cl.⁶ ............................................. B05D 1/02
[52] U.S. Cl. ............................ 427/424; 427/209; 427/421; 427/425; 118/108; 118/314; 118/320; 118/322; 118/324
[58] Field of Search .......... 427/209, 421, 424, 425; 118/108, 314, 320, 322, 324; 51/320, 321; 198/380, 402, 403

[56] References Cited
U.S. PATENT DOCUMENTS

| | | | |
|---|---|---|---|
| 4,545,155 | 10/1985 | Nakata | 51/320 |
| 4,561,219 | 12/1985 | Harada et al. | 51/319 |
| 4,674,238 | 6/1987 | Suzuki et al. | 51/418 |
| 4,760,673 | 8/1988 | Tsuchiya | 51/418 |
| 4,958,722 | 9/1990 | Kobayashi et al. | 198/735.3 |

FOREIGN PATENT DOCUMENTS

| | | |
|---|---|---|
| 59-74811 | 4/1984 | Japan . |
| 62-32050 | 2/1987 | Japan . |
| 62-200734 | 9/1987 | Japan . |
| 02-28945 | 1/1990 | Japan . |

*Primary Examiner*—Shrive Beck
*Assistant Examiner*—David M. Maiorana
*Attorney, Agent, or Firm*—Lane, Aitken & McCann

[57] ABSTRACT

A method of blasting IC frames as electronic components with a suitable apparatus, which prevents the frames from being caught by position restriction means during transfer, and eleiminates necessity for particular operations even if frames of different widths are continuously fed.

The blasting is carried out by turning a conveyor belt (8), which has support plate members (11) juxtaposed thereon and has a support groove (D) of an inverted triangular sectional shape formed thereon, jetting slurry onto the IC frames (F) merely placed on the slope surfaces inside the support support groove from a nozzles (2), turning then the frames by a reversion device (3) so as to place them on other slope surfaces, and jetting the slurry from other nozzles.

2 Claims, 4 Drawing Sheets

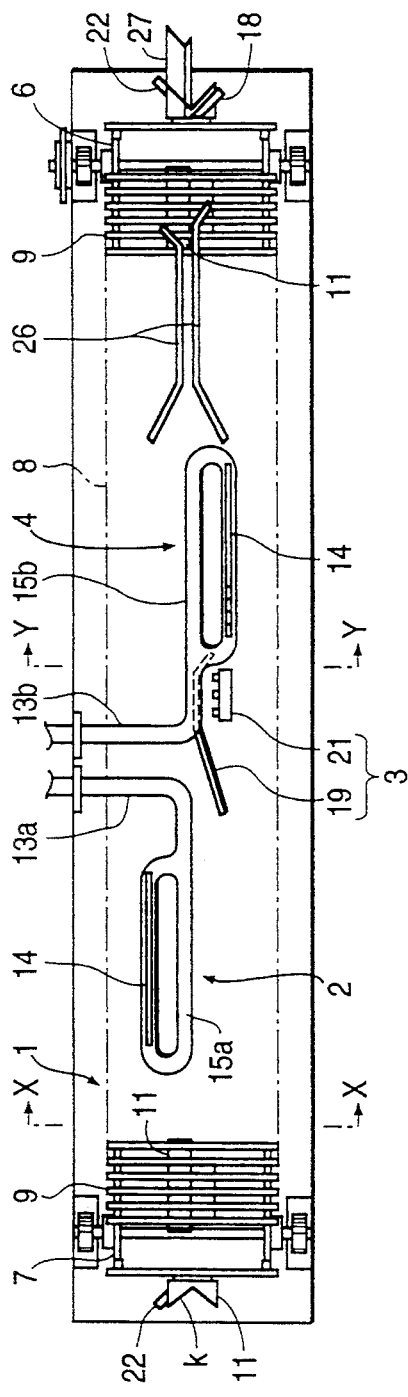
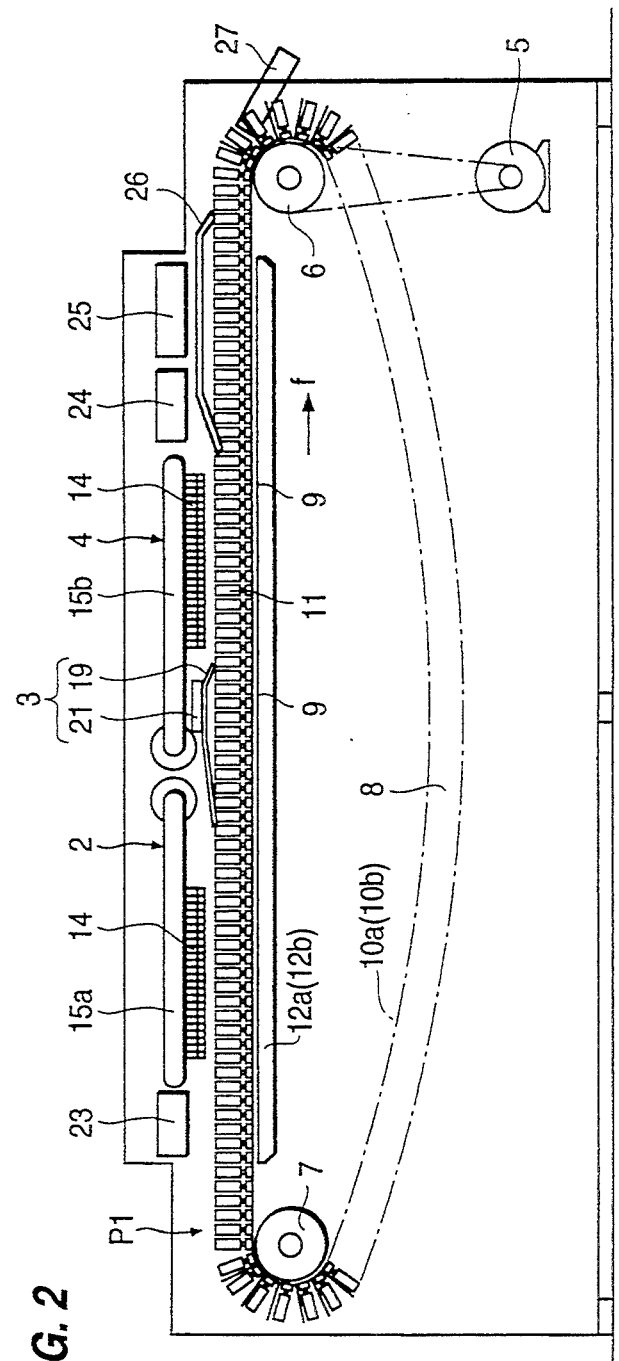
FIG. 1
FIG. 2

METHOD OF BLASTING IC FRAMES AND APPARATUS THEREFORE

FIELD OF THE INVENTION

The present invention relates to a method of blasting IC frames and an apparatus therefor which is used for removing burr or flash of synthetic resin attached to an oblong strip of IC frames wherein electronic devices are molded to a metallic plate made into lead.

BACKGROUND OF THE INVENTION

A method to mechanically and efficiently remove burr or flash of IC frames by spraying slurry from a nozzle device has been already known. In this method, in a device disclosed in Japanese Patent Publication No. 10578 of 1984 for instance, an IC frame is vertically held with both side edges thereof regulated not to move, while conveying the IC frame.

In the above mentioned method, any time an IC frame is caught by a restriction mechanism of a conveyor device during blasting treatment of said IC frames, or different kinds of IC frames having different widths are fed in the middle of the process, the restriction mechanism of the conveyor device has to be moved and adjusted, inconveniently. This becomes a factor greatly lowering the efficiency of continuous operations in a productive line. It is therefore an object of the present invention to solve the above problems.

SUMMARY OF THE INVENTION

According to a method of blasting IC frames of this invention, an endless conveyor belt, which has support plate members each having a notch of a inverted triangular shape juxtaposed thereon and has a support groove of an inverted triangular sectional shape formed thereon, is turned along a fixed track, and IC frames are intermittently fed to a conveyor starting position in the support groove, placed on one side of the support groove, on the slope surfaces of the support groove. In a fixed position during transfer of an IC frame, slurry is jetted onto the surface of the IC frame from a nozzle device, and a second fixed position the IC frame is turned along its lower hem by a reversion device and placed on the other slope surface of the support groove. Then, in a third fixed position slurry is jetted onto the surface the IC frame from another nozzle device.

In the above invention, the support groove is merely to support an IC frame placed on its inner surfaces of an inverted triangular shape. In this case, the IC frame is placed on the support groove with the lower hem thereof supported by the lowest part of the notches and the upper hem thereof free from any positional restriction. The IC frame is conveyed with the support groove in accordance with the movement of the support groove. Accordingly, neither the upper hem nor the lower hem of the IC frame is caught by a position restriction mechanism of a conveyor device during transfer, and any particular operation is not necessary even if frames of different widths are fed, because the upper hem of the IC frame is free from any positional restriction.

The present invention, wherein an IC frame is not caught by a position restriction mechanism of a conveyor device during transfer of the IC frame in the blasting treatment and any particular operation is not necessary even if different frames of different widths are fed, greatly effects the efficiency of continuous operations in a productive line.

BRIEF DESCRIPTION OF THE DRAWINGS

FIG. 1 is an entire plan view of a device according to the present invention.

FIG. 2 is an entire front view of the device of FIG. 1.

PREFERRED EMBODIMENTS OF THE PRESENT INVENTION

The present invention, as shown in FIGS. 1 and 2, comprises a conveyor device 1, a first nozzle device 2, a reversion device 3, and a second nozzle device 4.

Figure 3:
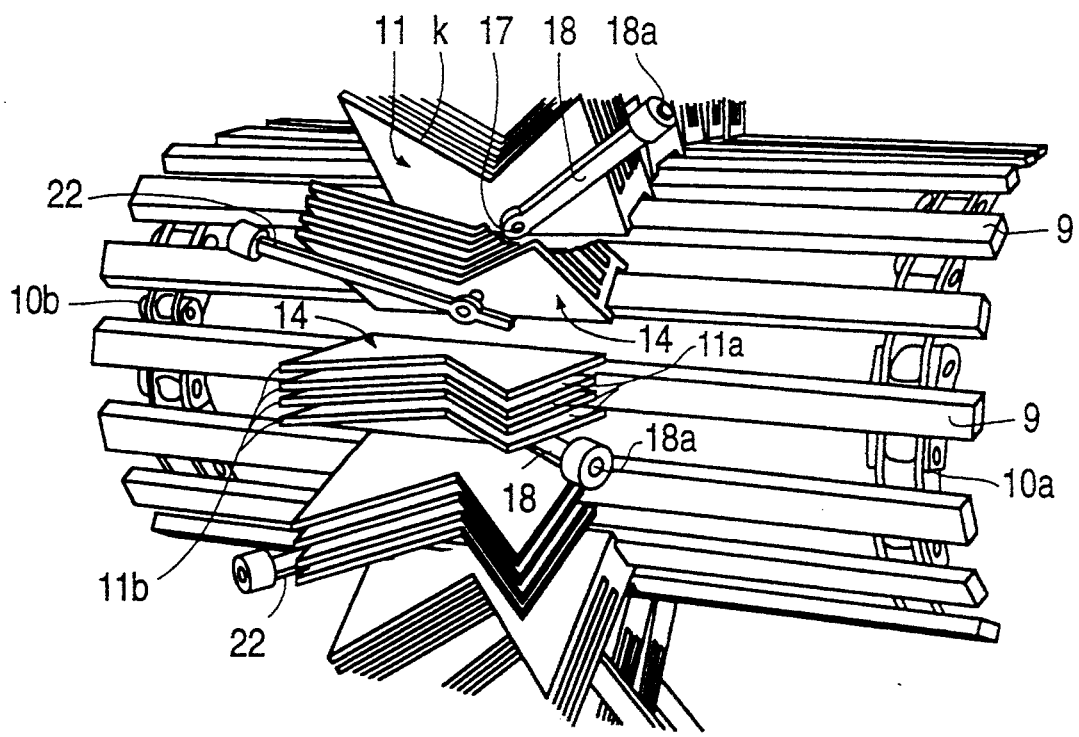
FIG. 3 is a perspective view of a conveyor belt of the above device guided by a driven sprocket wheel.
Figure 4A:
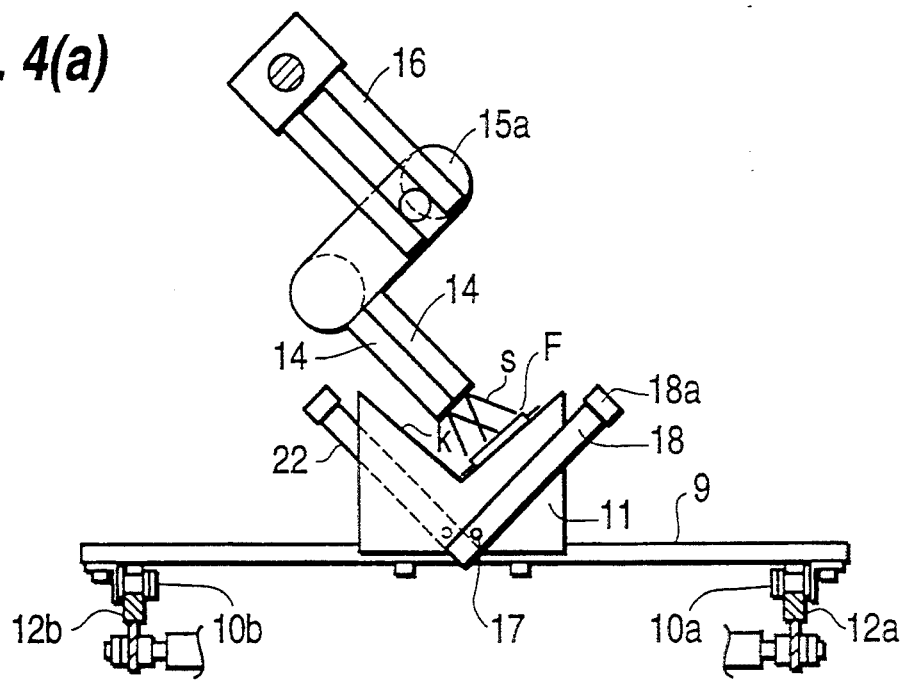
FIG. 4a is a cross section, showing a working condition of a nozzle device taken along the line X—X in FIG. 1.
Figure 4B:
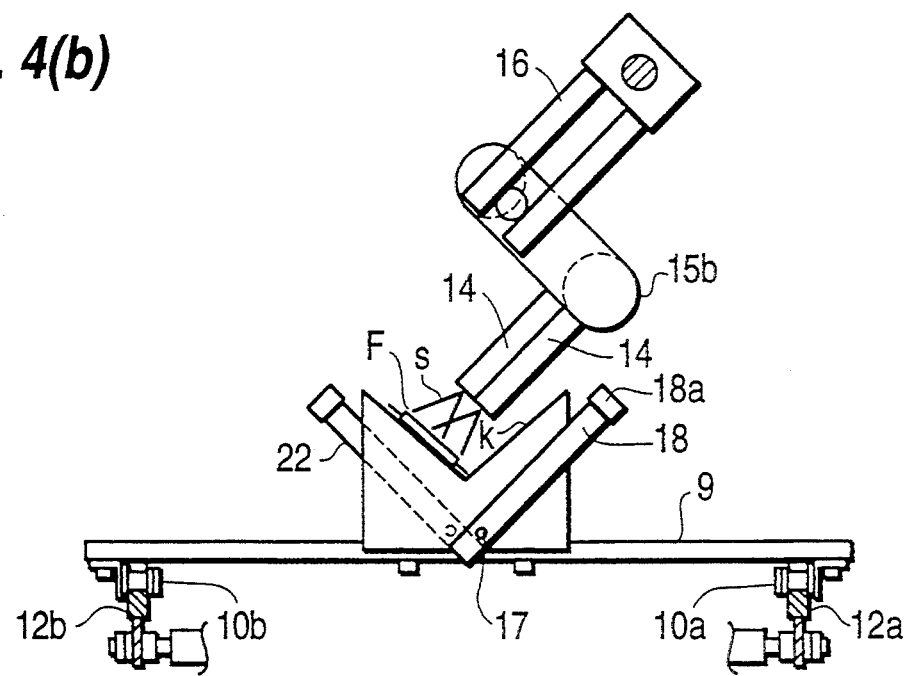
FIG. 4b is a cross section, showing a working condition of a nozzle device taken along the line Y—Y in FIG. 1.
Figure 5:
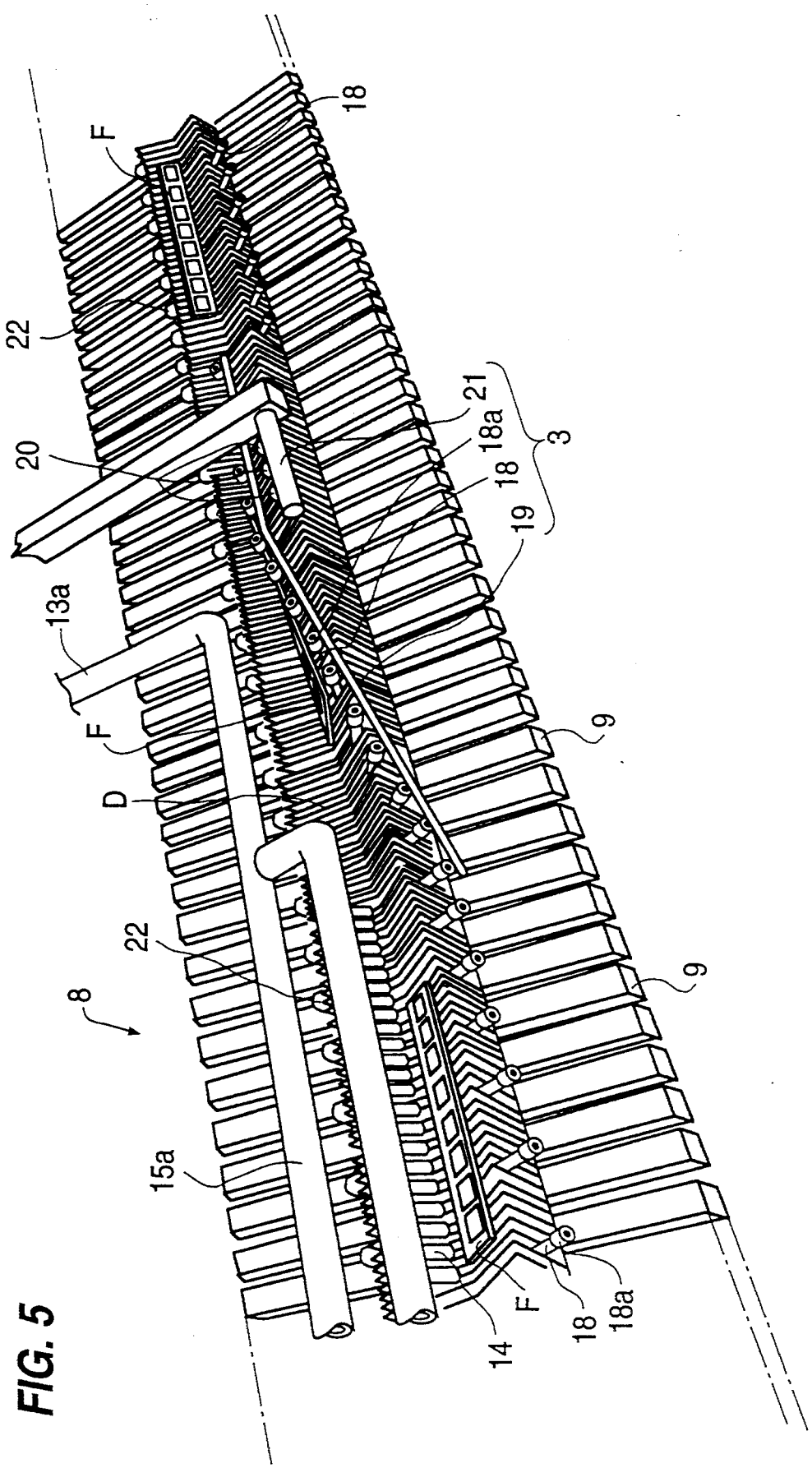
FIG. 5 is a perspective view showing a working condition of a reversion device during movement of tire conveyor belt of the device of FIG. 1.

The conveyor device 1 consists of a driving sprocket wheel 6 driven by motor 5, an idle driven sprocket wheel 7, and an endless conveyor belt 8 turnably hung on these sprocket wheels 6 and 7. The conveyor belt 8, as shown in FIGS. 3 and 4, comprises a number of side plates 9 connected with each other by means of two lines of chains 10a and 10b. Support plates 11 each having a notch k of an inverted triangular shape are fixed on the surface of each side plate 9 so as to form a support groove D, as shown in FIG. 5. It is preferable that a number of vertical grooves 11a in the width direction of the support plate 11 are provided on the body of each support plate 11 except the bottom part thereof in order to remove slurry effectively, and that the material of the support plate 11 is natural rubber or suitable synthetic resin in connection with the nature and impact of slurry S, with the prevention of damaging IC frames. Rails 12a and 12b support chains 10a and 10b.

Figure 6:
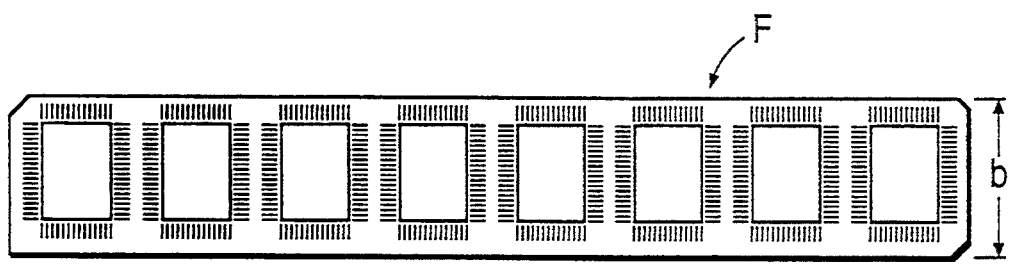
FIG. 6 shows an IC frame.

The nozzle device 2 consists of a supply pipe 13a to supply slurry S from a slurry supply pump which is not described here, and a loop pipe 15a on which a number of slurry nozzles 14 are fixed. The angle and position of the loop pipe 15a are adjustable. Namely, as shown in FIG. 4(a), the slurry nozzle 14 can be adjusted to jet slurry to a fixed position of the slope surfaces on one side of the notch k. More specifically, the angle and the position can be adjusted according to the width b of an IC frame F shown in FIG. 6. A device 16 supports the loop pipe 15a.

The reversion device 3, as shown in FIG. 5, consists of rocking bars 18 which are mounted on the surfaces of the support plates 11 in the vicinity of the lowest part of the support groove D at suitable intervals along the longitudinal direction of the conveyor belt 8 by means of shafts 17 (shown in Fig. 3) so as to be rockable in the half range of the notch k, and are forced downward by means of not illustrated springs. The reversion device 3 further consists of a bent guiding bar 19 for vertically moving the rocking bars 18 by engaging rollers 18a which are fixed to the tips of the rocking bars 18, and an air supply pipe 21 to which air supply nozzles 20 directed to the center of the notch k are fixed and whose jetting direction is adjustable. Between the rocking bars 18 rocking bars 22 like the rocking bars 18 are mounted to be rockable in the other half range of the notch k, and are forced downward by means of not illustrated springs. However, the rocking bars 22 are provided for a reason not relating to the present invention directly.

The nozzle device 4 is a symmetrical arrangement with the nozzle device 2. The slurry nozzle 14, as shown in FIG. 2(b), is adjusted to jet slurry to a fixed position on the other slope surface of the notch k, and a slurry supply pipe 13b and a loop pipe 15b are apart of the nozzle device 4.

Nozzle devices 23 and 24 have rinse nozzles to wash IC frames. Nozzle device 25 has nozzles to send out IC frames besides the rinse nozzles, guide bar 26 relates to the rocking bars 22, and guide gutter 27 is for an exit.

Now, the working examples and actions of the above mentioned invention are explained. First, the whole device is put into operation, wherein the conveyor belt 8 is turning and slurry S is jetted from slurry nozzles 14 of the nozzle devices 2 and 4. Then, IC frames F are mechanically or manually supplied from a conveyor starting position p1 of the conveyor belt 8 to the slope surfaces on one side of the support groove D, intermittently. The IC frame F is conveyed with the conveyor belt 8 in an arrow direction f. When it reaches a fixed position, its upper face is jetted with slurry in the area of the slurry nozzles for a suitable time by the nozzle device, as shown in FIG. 4(a). In this case, jetted slurry S is smoothly removed through the vertical grooves 11a of the support plates 11. When the conveyor belt 8 is moved further, as shown in FIG. 5, the rocking bars 18 are gradually upwardly shifted in accordance with the movement of the conveyor belt 8 with the roller 18a guided by the guide bar 19. The rocking bars 18 are eventually erected, and accordingly the IC frame F is erected in the support groove D. At this moment, air jetted from the air nozzles 20 pushes a side face of the IC frame F. Accordingly, the IC frame F is turned along its lower hem with, the help of gravity, and placed on the other slope surface of the support groove D. Afterward, when the IC frame F is moved further with the conveyor belt 8, its upper face is jetted with slurry in the area of the slurry nozzles 14 for a suitable time by another nozzle device 4, as shown in FIG. 4(b). In this way, both faces of the IC frame F are automatically and continuously blasted, and burr or flash of synthetic resin are clearly removed. When the blasting treatment is over, the IC frames are delivered outside the device one after another, and supplied to the next process.

We claim:
1. A method of blasting IC frames comprising:
turning along a fixed track an endless conveyor belt which has support plate members each having a notch of an inverted triangular shape juxtaposed thereon to define a support groove of an inverted triangular sectional shape thereon;
intermittently feeding IC frames to said support groove in a conveyor starting position to place the IC frames on one of the slope surfaces of said support groove;
in a first fixed position during transfer of the IC frames, jetting slurry onto the surface of the IC frames from a nozzle device;
in a second fixed position, turning the IC frames along their lower hems by a reversion device to place the IC frames on the other slope surface of the support groove; and
in a third fixed position, jetting slurry onto the surface of the IC frames from another nozzle device.

2. An apparatus for blasting IC frames comprising:
a conveyor device for turning an endless conveyor belt along a fixed track, said endless conveyor belt having support plates each having a notch of an inverted triangular shape juxtaposed thereon to define a support groove of an inverted triangular sectional shape thereon;
a nozzle device for jetting slurry toward one of the slope surfaces of the support groove along a portion of a conveyor track of said device which is upstream with respect to the direction of the turning of the endless conveyor belt;
a reversion device comprising rocking bars which are mounted on the surfaces of the support plates in the vicinity of the lowest position of the support groove at suitable intervals along the longitudinal direction of the conveyor belt by means of shafts, said rocking bars being forced downward, and a guiding bar for upwardly shifting said rocking bars by engaging said rocking bars; and
another nozzle device for jetting slurry toward the other slope surface of the support groove.

* * * * *